United States Patent [19]

Page, Jr.

[11] 3,713,040

[45] Jan. 23, 1973

[54] SIGNAL FREQUENCY CONTROLLER

[75] Inventor: John R. Page, Jr., Palo Alto, Calif.

[73] Assignee: Hewlett-Packard Company, Palo Alto, Calif.

[22] Filed: Dec. 23, 1971

[21] Appl. No.: 211,546

[52] U.S. Cl.......................331/1 A, 331/16, 331/18, 331/64

[51] Int. Cl...........................................H03b 3/04

[58] Field of Search....................331/1 A, 16, 18, 64

[56] References Cited

UNITED STATES PATENTS 3,364,439 1/1968 Cohen et al. ........................331/1 A

*Primary Examiner*—John Kominski
*Attorney*—A. C. Smith

[57] ABSTRACT

An improved frequency generator includes digital circuitry contained within a phase lock loop to maintain accurate phase-locked frequency control at a frequency selected by the signal generator being controlled and to provide a stable digital readout of the generator output of the selected frequency.

6 Claims, 2 Drawing Figures

SIGNAL FREQUENCY CONTROLLER

BACKGROUND OF THE INVENTION

Phase-locked frequency generator systems are commonly used to eliminate long-term drift and to enhance the stability of the frequency generator. Where digital display of the frequency produced by the generator is desired, the digital display is usually connected outside of the phase-locked loop in circuits of convention design. Alternatively, the frequency division factors of the circuit may be used to compute the actual frequency for digital display. Circuits of this type are described in the literature (see, for example, U. S. Pat. No. 3,293,559 issued on Dec. 20, 1966, to D. L. Howard et al).

SUMMARY OF THE INVENTION

In accordance with the present invention, digital circuitry is included in the phase-locked loop to provide both the phase-locked operation on selected frequencies and to display the selected frequency. The circuit of the present invention may be operated to provide substantially continuous phase lock and also to permit frequency modulation of the controlled oscillator.

The controlled oscillator may be preset manually to a selected frequency that is digitally displayed and then may be digitally maintained at the preset frequency with the operating frequency digitally displayed. Digital divider techniques are used to produce wide dynamic range of output frequencies while the controlled oscillator is tuned only over a narrow range of frequencies. The controlled oscillator can be divided down by a fixed scaler and a programmable time base adjusts gate period in order to count and display the actual selected frequency on the digital counter.

DESCRIPTION OF THE PREFERRED EMBODIMENT

Figure 1:
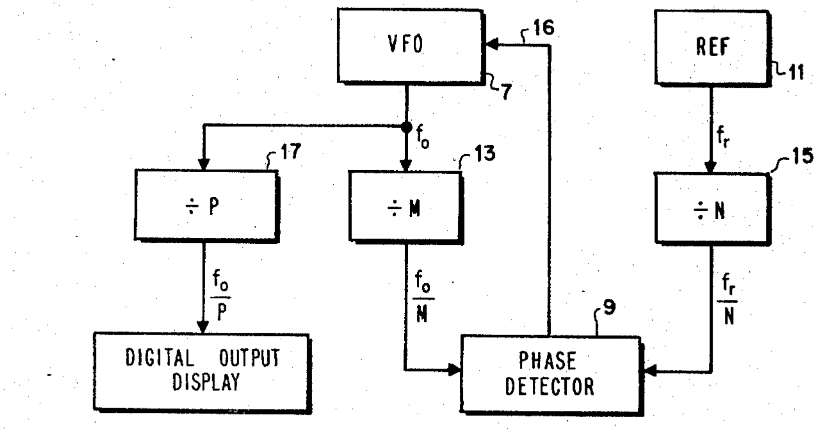
Figure 1 (Prior Art)
FIG. 1 is a schematic diagram of a conventional phase-locked oscillator circuit with digital frequency display.

Referring now to FIG. 1, there is shown a block diagram of a conventional phase-lock circuit including a digital display. In this conventional circuit, the output frequency of the variable-frequency oscillator 7 is compared with a reference frequency from oscillator 11. Each of these frequencies may be divided down in frequency dividers 13, 15 which divide the respective signal frequencies by variable division factors that make the frequencies to be compared substantially equal. In this way, the divided output frequency applied to phase detector 9 is substantially equal to the divided reference frequency, independently of the frequency of oscillator 7. The resulting phase comparison of the two frequencies in phase detector 9 produces the control signal on line 16 which controls the variable-frequency oscillator 7 for stabilizing its output frequency substantially to the degree of stability of the reference oscillator 11. The desired output signal frequency may then be produced over a wider range of frequencies by dividing the output frequency of oscillator 7 by a variable factor P in the signal divider 17. One difficulty encountered in conventional circuits of this type is that digital display of the output frequency requires high frequency-counting techniques applied directly to the output frequency or requires complicated circuits which derive the display of the output frequency from the frequency division factors in the system.

Figure 2:
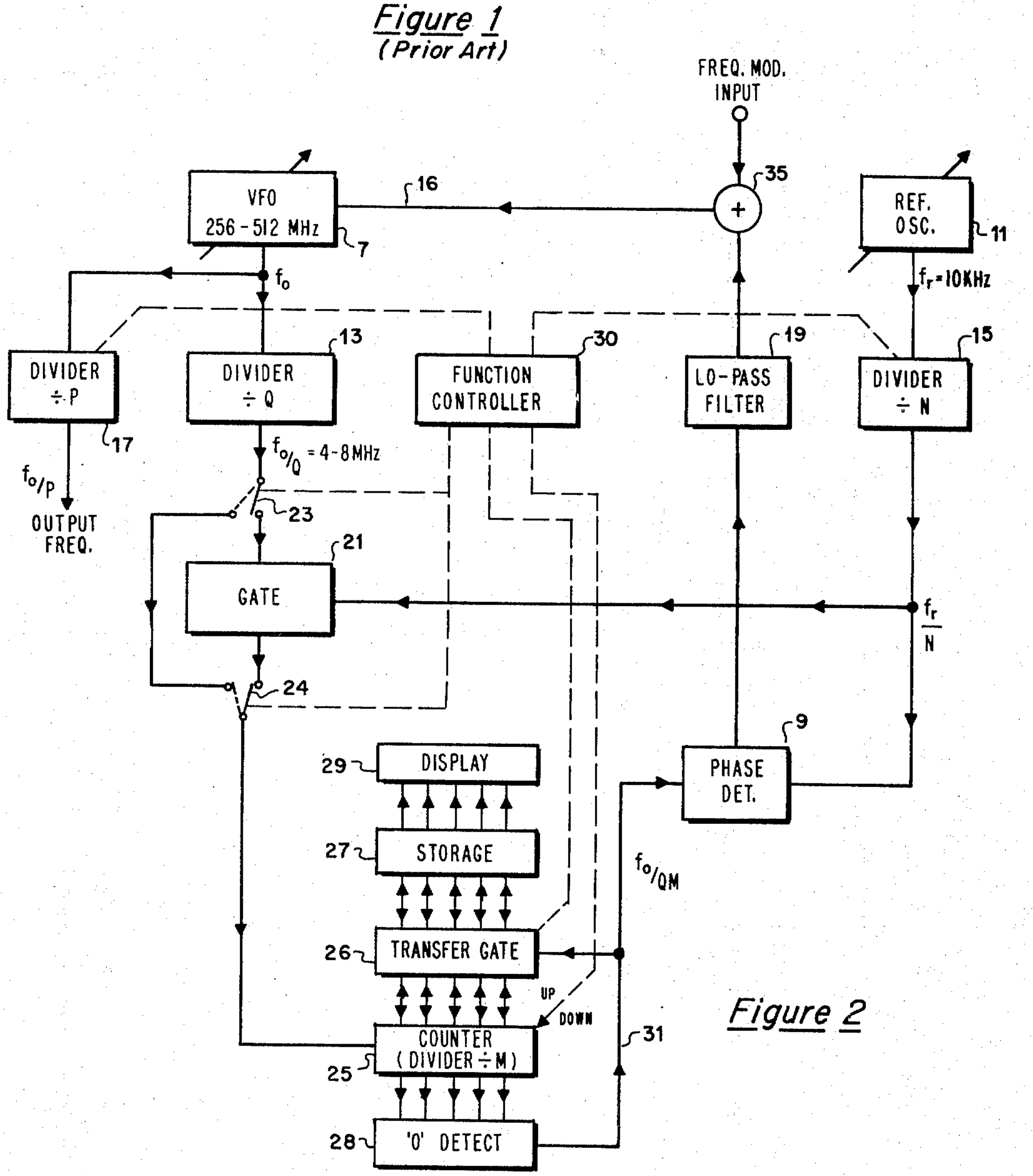
FIG. 2 is a schematic diagram of the circuit of the present invention which includes digital circuitry in the phase-lock circuit.

With reference to FIG. 2, there is shown a block diagram of the circuit of the present invention. The output frequency from oscillator 7 is divided in frequency and is compared in the phase detector 9 with the divided reference frequency from oscillator 11. The resulting error signal representative of the phase variation between the compared frequencies is applied through low-pass filter 19 and summation network 35 to the control input 16 of the variable-frequency oscillator 7. With the aid of switching means 23 and 24, the present circuit may be operated in either of two modes. In the first mode, the divided frequency from oscillator 7 is gated into a counter 25 to provide a digital indication of the desired output frequency from divider 17. In the second mode, the counter 25 is operated as a variable-modulus divider and is included in the phase-lock circuitry that stabilizes the oscillator 7.

With reference to the operation of the present circuit in the first mode, the output frequency of the variable-frequency oscillator 7 is divided in optional divided 13 by a fixed factor Q to yield a signal $fo/Q$ that is applied to gate 21 through switch 23. The time base for the gate 21 is derived from the reference oscillator 11 divided in divider 15 by a variable division factor N. The gated output frequency is then applied to the counter 25 through switch 24. The count of the gated frequency taken by counter 25 (operating as an UP-counter) is transferred to the storage register 27 through the transfer gates 26 at the end of the gated counting period. The display 29, say, to five significant digits, is then driven from the storage register 27. The variable-frequency oscillator 7 may thus be manually adjusted over a relatively narrow range, say, from 256 MHz to 512 MHz, while the output frequency $f_0/P$ may be adjusted over a much wider range of frequencies simply by altering the division factor P of the divider 17. The gate period is adjusted in order to provide the proper indication of output frequency on display 29 simply by altering the division factor N in divider 15. The values for P and N, which are adjusted by function controller 30 as required to produce output frequencies over the range from .5 MHz to 512 MHz with full five-digit display, are listed in the following table for Q = 64, and $f_r$ = 10 kHz:

| P | N | Output Frequency |
|---|---|---|
| 1 | 64 | 256–512 MHz |
| 2 | 32 | 128–256 MHz |
| 4 | 160 | 64–128 MHz |
| 8 | 80 | 32–64 MHz |
| 16 | 40 | 16–32 MHz |
| 32 | 200 | 8–16 MHz |
| 64 | 100 | 4–8 MHz |
| 128 | 50 | 2–4 MHz |
| 256 | 25 | 1–2 MHz |
| 512 | 125 | 0.5–1 MHz |

After the oscillator 7 is manually adjusted to the desired output frequency while the circuit is operating in the first mode, switches 23 and 24 may be set, under control of the function controller 30, to the alternate position which by-passes the gate 21. In this second operating mode, the counter 25 is operated as a variable-modulus divider which introduces a variable division factor M in the frequency from divider 13. The number counted by counter 25 prior to resetting of the switches 23 and 24 is set into the register 27 where it is retained for subsequent cyclical use. This number is then preset into the counter 25 via the transfer gate 26 and the counter 25 (operating as a DOWN-counter) counts downwardly from the preset number to zero. The zero-detect circuit 28 detects the occurrence of zero count in the counter 25 and produces a signal on line 31 that is applied to transfer gate 26 to again preset the number stored in register 27 into the counter 25. In this manner, the counter 25 is caused to count cyclically a number M of pulses applied to its input, where M is the number which was last counted by the counter 25 during operation of the circuit in the first mode and which was stored in the register 27. It should be understood, of course, that other variable-modulus dividers may be used in place of the counter-register combination previously described in order to introduce the variable division factor M.

The signals from the zero-detect circuit 28 recur at a rate equal to the frequency $f_0$ of the variable-frequency oscillator 7 divided by the factors Q and M provided, respectively, by the divider 13 and the counter 25, and these signals are compared in the phase detector 9 with the reference frequency $f_r$ divided by the factor N provided by divider 15. The output of the phase detector 9 is filtered in the low-pass filter 19 and is combined in the summation network 35 with modulation signal, as later described. The resultant control signal is applied to the control input 16 of the variable-frequency oscillator 7 to control and stabilize its output frequency. The desired output frequency $f_0$ divided by the factor P is therefore stabilized substantially to the degree of stability of the reference oscillator 11 by the circuitry of the present invention and is also properly indicated on digital display 29. It should be noted that the digital display 29 indicates only the number count that was stored in the register 27 during operation of the circuit in the first mode and that this display of the desired output frequency ($f_0$ divided by P) is therefore a stable display without variations in the displayed digits. Any drift in the frequency of the variable-frequency oscillator 7 will cause the divided signal $fo$/QM present at the input to phase detector 9 to change in frequency and this change in frequency will effectively apply a D.C. correction signal to the oscillator 7 to maintain the resultant output frequency at the value indicated by the digital display 29 and in phase lock with the frequency derived from the reference oscillator 11.

Because of the division factors (of the order of $10^7$) operating on frequency from oscillator 7 before it is applied to the input of phase detector 9, the variable-frequency oscillator 7 can be frequency modulated with resulting large phase deviations (of the order of $10^7$ radians) without exceeding the dynamic range of the phase detector 9. The effective bandwidth of the present phase-lock circuit may be made small (of the order of 5 Hz) and can be accommodated by the above-mentioned large division factor. Frequency-modulating signal may be applied to the variable-frequency oscillator 7 at a rate of, say, 10 Hz or greater (i.e., greater than the loop bandwidth), and only produce a resulting phase deviation that is within the linear range (say, 1 radian) of the phase detector 9. The frequency-modulating input signal may be applied through the summation network 35 to frequency modulate the variable-frequency oscillator 7 while still maintaining phase-locked operation of the system.

I claim:

1. Signal translating apparatus comprising:

signal generating means for producing a signal frequency which may be altered in response to a control signal applied thereto;

digital circuit means connected to receive said signal frequency for registering events at a rate related to the signal frequency and for producing an output signal in response to registration of a selectable number of events;

output means including storage means coupled to said digital circuit means for storing a digital signal indicative of said selectable number and for providing an output indication representative of said selectable number;

a source of reference frequency; and comparator means connected to receive said reference frequency and said output signal from the digital circuit means for applying control signal to said signal generating means to control the signal frequency thereof in response to the signals applied to said comparator means deviating from a predetermined relationship.

2. Signal translating apparatus as in claim 1 wherein:

said digital circuit means includes a scaler circuit capable of accumulating a count of signals applied thereto; and said output means includes a storage register for storing signals representative of the count taken by the scaler circuit of said selectable number of events.

3. Signal translating apparatus as in claim 2 wherein said digital circuit means includes transfer means for presetting said scaler circuit to a signal condition representative of the count stored in said storage register, said scaler circuit producing said output signal in response to accumulation of a count indicative of said preset signal condition.

4. Signal translating apparatus as in claim 3 comprising:

gating means coupled to the source of reference frequency and connected to selectively gate therethrough the signal frequency from said signal generating means to the digital circuit means during a gate period determined by said reference frequency for accumulating said selectable number of events in said scaler circuit;

switching means selectively operable in a first mode which enables said gating means to selectively gate therethrough the signal frequency from the signal generating means to the digital circuit means during a gate period, and in a second mode which applies said signal frequency from the signal generating means substantially continuously to said digital circuit means;

said transfer means recurringly presets said scaler circuit to said signal condition representative of the count stored in said storage register in response to the recurring accumulation of said count indicative of said preset signal condition during operation of said switching means in said second mode of operation; and said output signal is applied to said comparator means in response to each accumulation of the count indicative of said preset signal condition.

5. Signal translating apparatus as in claim 1 comprising a signal network coupled to said comparator means for applying to said signal generating means as a control signal therefor the combination of an input modulation signal applied to said signal network and the signal produced by said comparator means.

6. Signal translating apparatus as in claim 1 comprising:

a plurality of frequency converter means, each capable of converting an applied frequency to a different frequency that is proportional by a selected factor to the frequency applied thereto;

means connecting a first one of said frequency converter means intermediate said signal generating means and said digital circuit means; and means connecting another one of said frequency converter means to receive said signal frequency from the signal generating means for producing therefrom an output signal having a frequency which is represented by the output indication provided by said output means.

* * * * *